(12) United States Patent
Oh et al.

(10) Patent No.: US 9,640,594 B2
(45) Date of Patent: May 2, 2017

(54) TRANSPARENT ORGANIC LIGHT EMITTING DISPLAY DEVICE

(71) Applicant: Samsung Display Co., Ltd., Yongin (KR)

(72) Inventors: Eon-Seok Oh, Seoul (KR); Sang-Yeol Kim, Hwaseong-si (KR); Il-Seok Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/688,635

(22) Filed: Apr. 16, 2015

(65) Prior Publication Data

US 2016/0104752 A1   Apr. 14, 2016

(30) Foreign Application Priority Data

Oct. 8, 2014 (KR) .......................... 10-2014-0135536

(51) Int. Cl.
 *H01L 27/32* (2006.01)
 *H01L 51/52* (2006.01)
(52) U.S. Cl.
 CPC ........ *H01L 27/3232* (2013.01); *H01L 27/326* (2013.01); *H01L 51/5284* (2013.01)
(58) Field of Classification Search
 CPC ..... H01L 23/18; H01L 31/0488; H01L 51/52; H01L 51/5281; H01L 27/326;
 (Continued)

(56) References Cited

U.S. PATENT DOCUMENTS 6,001,277 A * 12/1999 Ichimura ........... G02F 1/133711
                                                   252/299.4
8,896,900 B2   11/2014 Park et al.
(Continued)

FOREIGN PATENT DOCUMENTS

JP   2011-107454   *  6/2011   ............... G09F 9/30
JP   2014-072126      4/2014
(Continued)

OTHER PUBLICATIONS

Translaltion of JP2011-107454 (Morimoto et al. ) (Nov. 18, 2009) , 17 pages.*

(Continued)

*Primary Examiner* — Caridad Everhart
(74) *Attorney, Agent, or Firm* — H.C. Park & Associates, PLC

(57) ABSTRACT

A transparent organic light emitting display device having a pixel region on which an image is displayed and a transparent region through which external light passes. The transparent organic light emitting display device includes a first substrate, a second substrate opposing the first substrate, a display unit disposed between the first substrate and the second substrate, the display unit including an organic light emitting diode. A sealing unit is disposed between the first substrate and the second substrate to surround the display unit and to bond the first substrate to the second substrate. A filling unit is disposed in an inner side of the sealing unit to cover the display unit, the filling unit including a silicon filling material and a photochromic material.

16 Claims, 8 Drawing Sheets

(58) Field of Classification Search
CPC ............... H01L 27/3269; H01L 51/524; H01L 51/5284; H01L 31/02162; H01L 27/14625; H01L 27/3213; H01L 27/322; H04N 13/0454
USPC ........................................................ 359/267
See application file for complete search history.

(56) References Cited

U.S. PATENT DOCUMENTS

| | | | |
|---|---|---|---|
| 2006/0222973 A1* | 10/2006 | Iftime ................... | G02F 1/0126 430/19 |
| 2007/0047058 A1* | 3/2007 | Lim ................... | G02B 27/2214 359/267 |
| 2007/0268440 A1* | 11/2007 | Nagano ............. | G02F 1/133753 349/141 |
| 2008/0143939 A1* | 6/2008 | Adachi ............. | G02F 1/133555 349/114 |
| 2009/0079887 A1* | 3/2009 | Yang ................. | G02F 1/136213 349/38 |
| 2010/0237458 A1* | 9/2010 | Kakehata ............. | H01L 27/112 257/507 |
| 2011/0279883 A1* | 11/2011 | Kumar ................... | C09B 57/00 359/241 |
| 2013/0206230 A1* | 8/2013 | Sridharan ............... | H01L 23/10 136/259 |
| 2014/0185129 A1* | 7/2014 | Kim .................... | H01L 51/5284 359/296 |

FOREIGN PATENT DOCUMENTS

| | | | | |
|---|---|---|---|---|
| KR | 10-2012-0101262 | 9/2012 | | |
| KR | 10-2013-0074622 | 7/2013 | | |
| KR | 2013-0137946 A | * 12/2013 | ............. | G02B 27/26 |
| KR | 10-2014-0063174 | 5/2014 | | |

OTHER PUBLICATIONS

Translation of KR2013-0137946 A (Kim et al )(Dec. 18, 2013, 15 pages.*

* cited by examiner

TRANSPARENT ORGANIC LIGHT EMITTING DISPLAY DEVICE

CROSS-REFERENCE TO RELATED APPLICATION

This application claims priority from and the benefit of Korean Patent Application No. 10-2014-0135536, filed on Oct. 8, 2014, which is hereby incorporated by reference for all purposes as if fully set forth herein.

BACKGROUND

Field

Exemplary embodiments relate to a display device. More particularly, exemplary embodiments relate to a transparent organic light emitting display device.

Discussion of the Background

Generally, an organic light emitting display device has advantages over other types of displays, such as low power consumption, wide viewing angle, quick response time, and stability at low temperatures, because an organic light emitting display device includes organic light emitting diodes that are self-emitting diodes.

The transparent organic light emitting display device has a pixel region on which an image is displayed and a transparent region through which external light passes. The transparent organic light emitting display device provides the display information to a user using the pixel region and the opposite situation to user using the transparent region.

When the pixel region is formed to be relatively large so as to increase an ability of information transfer of the transparent organic light emitting display device, the transparent region may be formed to be relatively small, thereby decreasing a transmittance of the transparent organic light emitting display device. On the other hand, when the transparent region is formed to be relatively large so as to increase the transmittance, the pixel region can be formed to be relatively small, thereby decreasing the ability of information transfer under high ambient illumination.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a transparent organic light emitting display device capable of improving durability and increasing an ability of information transfer under high ambient illumination.

Additional aspects will be set forth in the detailed description which follows, and, in part, will be apparent from the disclosure, or may be learned by practice of the inventive concept.

An exemplary embodiment of the present invention discloses a transparent organic light emitting display device having a pixel region on which an image is displayed, and a transparent region through which external light passes. The transparent organic light emitting display device may include a first substrate, a second substrate opposing the first substrate, and a display unit disposed between the first substrate and the second substrate, the display unit including an organic light emitting diode. A sealing unit is disposed between the first substrate and the second substrate to surround the display unit and to bond the first substrate to the second substrate, and a filling unit is disposed in an inner side of the sealing unit to cover the display unit, the filling unit including a silicon filling material and a photochromic material.

An exemplary embodiment also discloses a transparent organic light emitting display device having a pixel region on which an image is displayed, and a transparent region through which external light passes. The transparent organic light emitting display device may include a first substrate on which a thin film transistor is disposed, a second substrate opposing the first substrate, and a display unit disposed between the first substrate and the second substrate, the display unit including an organic light emitting diode. A photochromic layer is disposed on at least one selected from the first substrate and the second substrate, in which a color of the photochromic layer is changeable by exposure to the external light.

An exemplary embodiment of the present invention also discloses a transparent organic light emitting display device having a pixel region on which an image is displayed, and a transparent region through which external light pass. The transparent organic light emitting display device may include a first substrate, a second substrate opposing the first substrate, and a display unit disposed between the first substrate and the second substrate, the display unit including an organic light emitting diode and a photochromic layer, of which a color is changeable by exposure to the external light.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
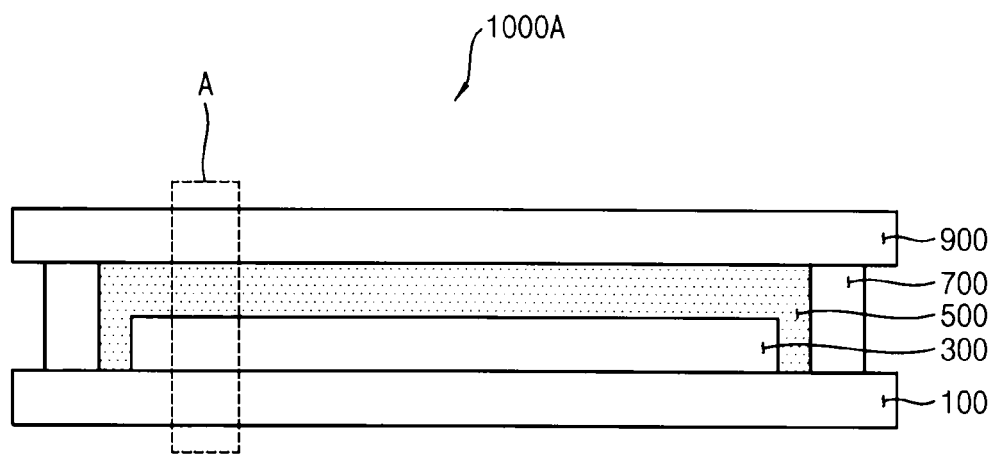
FIG. 1 is a cross-sectional view illustrating a transparent organic light emitting display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating a transparent organic light emitting display device according to an exemplary embodiment.

Referring to FIG. 1, the transparent organic light emitting display device 1000A may include a first substrate 100, a display unit 300, a filling unit 500, a sealing unit 700, and a second substrate 900.

The first substrate 100 may be disposed to oppose the second substrate 900. One of the first substrate 100 or the second substrate 900 may be a base substrate, and the other of the first substrate 100 or the second substrate 900 may be an encapsulation substrate. The first substrate 100 or the second substrate 900 may include a transparent insulation substrate. For example, the first substrate 100 or the second substrate 900 may include a glass substrate, a quartz substrate, or a transparent resin substrate, etc. The transparent resin substrate may include polyamide resin, acryl resin, polyacrylate resin, polycarbonate resin, polyether resin, polyethylene terephthalate resin, or sulfonic acid resin, etc.

The display unit 300 may be disposed between the first substrate 100 and the second substrate 900. For example, the display unit 300 may include an organic light emitting diode emitting the light and a thin-film transistor for providing the driving current to the organic light emitting diode. The organic light emitting diode may include a pixel electrode, an emitting layer, and a common electrode.

The filling unit 500 may be disposed in an inner side of the sealing unit 700 to cover the display unit 300. The filling unit 500 may include a silicon filling material and a photochromic material. The filling unit 500 may include a silicon filling material to improve a mechanical strength of the transparent organic light emitting display device 1000A without damage to the organic light emitting diode. In an example, the silicon filling material may include a polydimethysiloxane and a hydrosilane. The silicon filling material may further include at least one selected from a platinum catalyst and an inhibitor. In addition, the filling unit 500 may include a photochromic material to increase an ability of information transfer of the transparent organic light emitting display device 1000A under high ambient illumination. In one example, the photochromic material may include at least one selected from a silver chloride (AgCl), a silver bromide (AgBr), a silver iodide (AgI), a pyran, an oxazine, and a fulgide. Hereinafter, the filling unit 500 will be described in detail with reference to the FIG. 3.

The sealing unit 700 may be disposed between the first substrate 100 and the second substrate 900 to surround the display unit 300. The sealing unit 700 may bond the first substrate 100 to the second substrate 900. Thus, the sealing unit 700 may surround the display unit 300 to isolate the display unit 300 from the external environment including moisture and gas. To achieve such isolation, the sealing unit 700 may include a material that can effectively prevent penetration of moisture or gas without the need for an absorbent material. For example, the sealing unit 700 may contain inorganic material, such as the frit, but is not limited thereto. The sealing unit 700 may be melted by laser irradiation, and may be hardened for sealing between the first substrate 100 and the second substrate 900.

Furthermore, the transparent organic light emitting display device 1000A may further include a photochromic layer. The photochromic layer may be disposed on at least one selected from the first substrate 100 and the second substrate 900 or disposed inside of the display unit 300. A color of the photochromic layer may be changed by the external light. In one example, the photochromic layer may be disposed at least in part on the transparent region to effectively increase the ability of information transfer under high ambient illumination.

Figure 2:
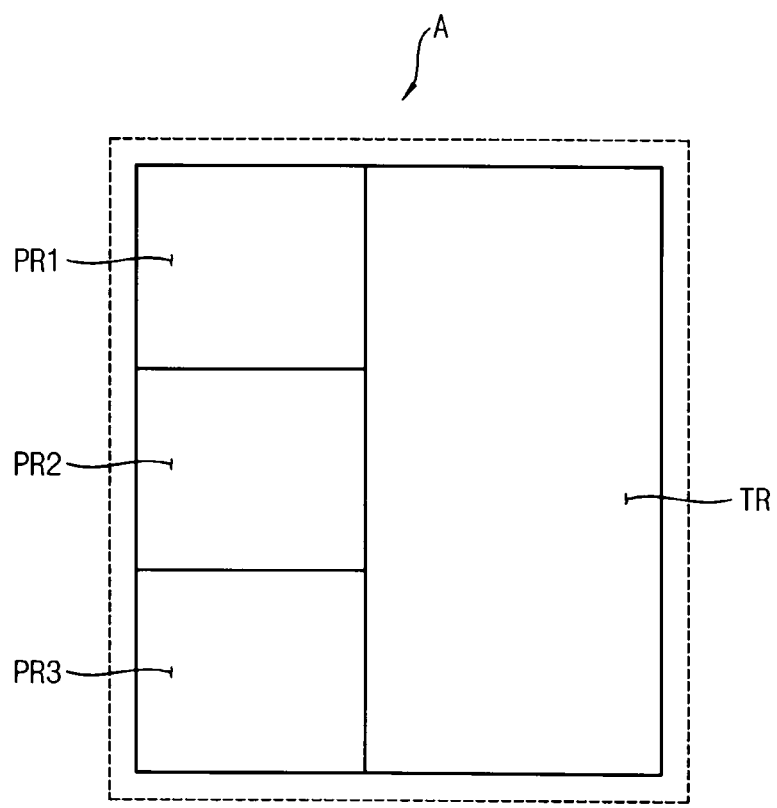
FIG. 2 is a plan view illustrating a portion 'A' of FIG. 1.

FIG. 2 is a plan view illustrating a portion 'A' of FIG. 1.

Referring to FIG. 2, a transparent organic light emitting display device may have a pixel region on which an image is displayed, and a transparent region through which external light passes. For example, the transparent organic light emitting display device may have a first pixel region PR1 emitting the red color light, a second pixel region PR2 emitting the green color light, a third pixel region PR3 emitting the blue color light, and the transparent region TR through which the external light passes. Thus, the first through third pixel regions PR1 through PR3 may display the image using the red color light, green color light, and blue color light. The transparent region TR may provide the opposite situation to a user because the external light passes through the transparent region TR.

When the first through third pixel regions PR1 through PR3 are formed to be relatively large to increase an ability of information transfer of the transparent organic light emitting display device, the transparent region TR can be formed to be relatively small, thereby decreasing a transmittance of the transparent organic light emitting display device. On the other hand, when the transparent region TR is formed to be relatively large to increase the transmittance, the first through third pixel regions PR1 through PR3 can be formed to be relatively small, thereby decreasing the ability of information transfer. Especially, under high ambient illumination, a visibility of the display device may be decreased as a result of the external light incident on the transparent organic light emitting display device. In addition, the transparent organic light emitting display device having high resolution may include relatively large non-display regions on which the light is not emitted. Therefore, it is necessary to adjust the size of the first through third pixel regions PR1 through PR3 in consideration of the ability of information transfer and the transmittance of the transparent organic light emitting display device. Because the transparent organic light emitting display device can increase the ability of information transfer using the filling unit and/or the photochromic layer, a mixing ratio of the silicon filling material to the photochromic material may be adjusted, or additional photochromic layer may be formed, in consideration of the sizes of the first through third pixel regions PR1 through PR3 and the transparent region TR.

Figure 3:
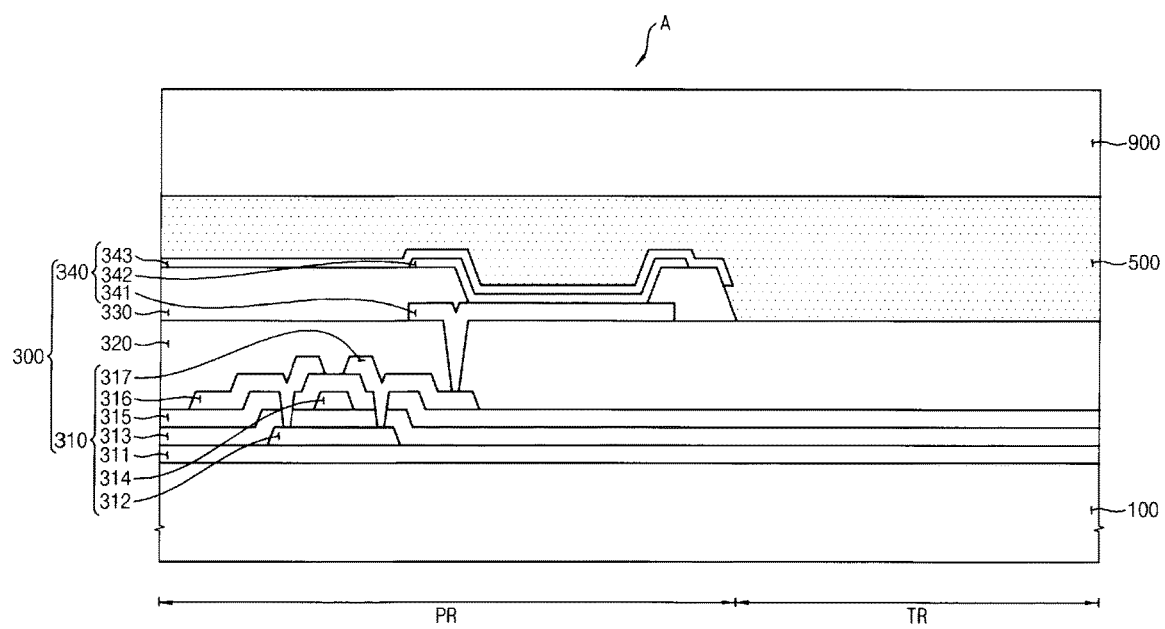
FIGS. 3 through 5 are cross-sectional views illustrating examples of a portion 'A' of FIG. 1.
Figure 4:
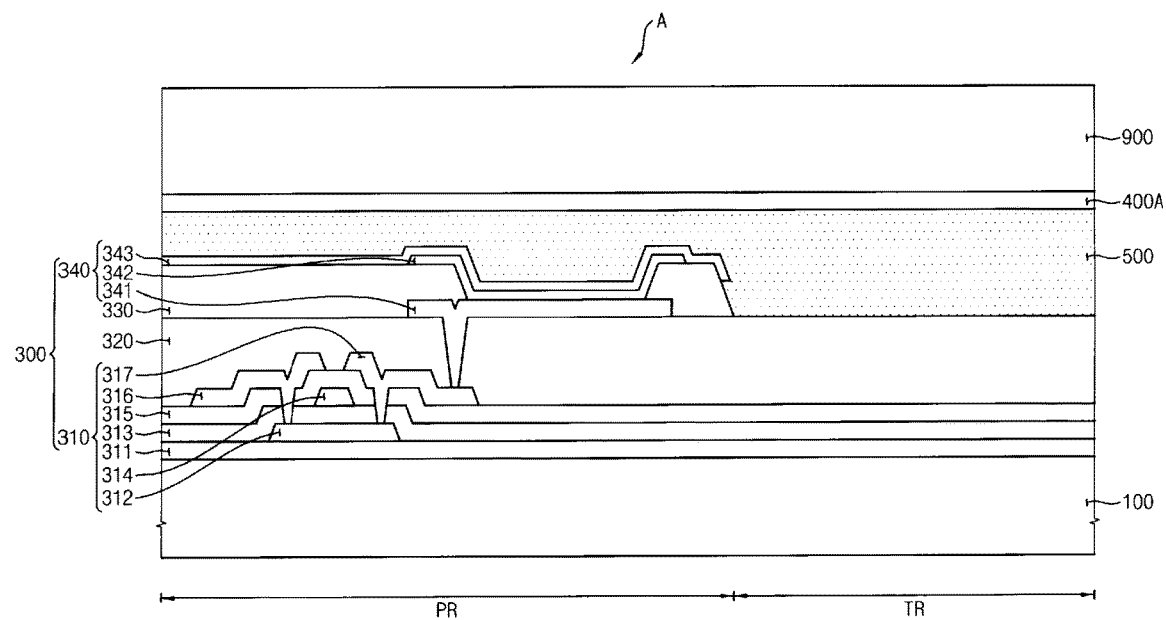
Figure 5:
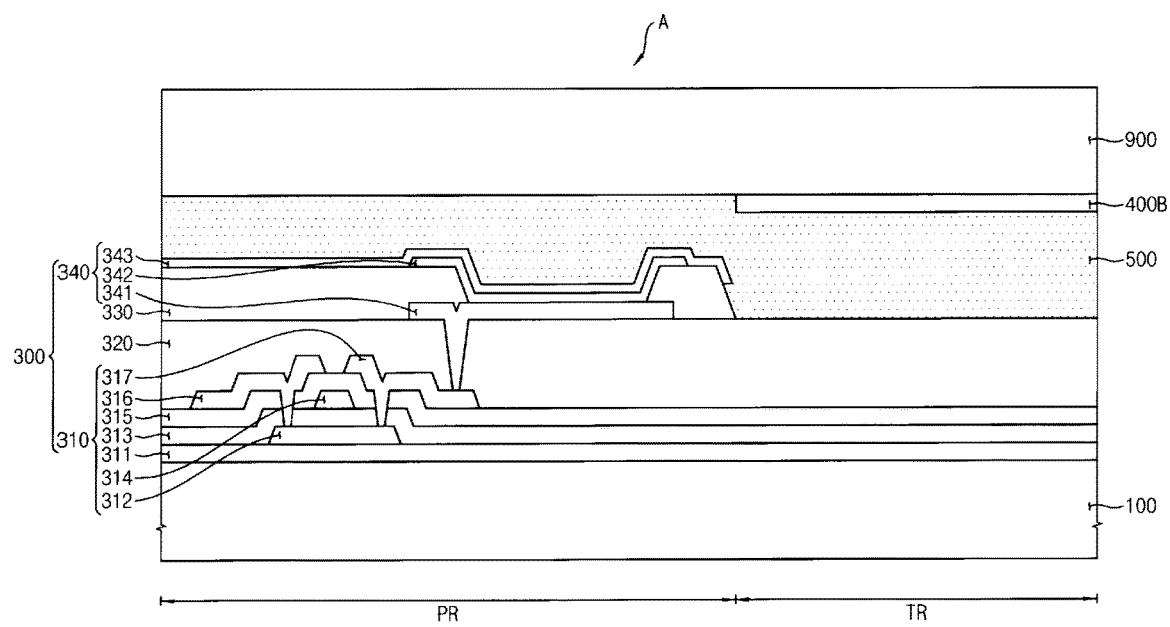

FIGS. 3 through 5 are cross-sectional views illustrating examples of a portion 'A' of FIG. 1.

Referring to FIGS. 3 through 5, a filling unit of the transparent organic light emitting display device may include a silicon filling material and a photochromic material such that a durability of the transparent organic light emitting display device is improved without damage to the organic light emitting diode. Furthermore, information transfer capability of the transparent organic light emitting display device may be increased even under high ambient illumination.

As shown in FIG. 3, the transparent organic light emitting display device may include a first substrate 100, a display unit 300, a filling unit 500, and a second substrate 900.

The display unit 300 may be disposed between the first substrate 100 and the second substrate 900. The display unit 300 may include a thin-film transistor 310 and an organic light emitting diode 340.

The thin-film transistor 310 may include a buffer layer 311, an active layer 312, a gate insulation layer 313, gate electrode 314, an inorganic insulation layer 315, a source electrode 316, and a drain electrode 317.

A buffer layer 311 may be disposed on the first substrate 100. The buffer layer 311 may prevent diffusion of metal atoms and/or impurities from the first substrate 100. In addition, the buffer layer 311 may improve flatness of the surface of the first substrate 100. The active layer 312 may include amorphous silicon, poly-silicon, and organic semiconductor materials. The gate insulation layer 313 may be disposed on the active layer 312. The gate insulation layer 313 may entirely cover the active layer 312. The gate electrode 314 may be disposed on the gate insulation layer 313 and may overlap the active layer 312. The inorganic insulation layer 315 may be disposed on the gate electrode 314 and may entirely cover the gate electrode 314. The source electrode 316 may be electrically connected to the active layer 312 through a first contact hole that is formed in the gate insulation layer 313 and the inorganic insulation layer 315. For example, the source electrode 316 may contact a first end portion of the active layer 312. In addition, the source electrode 316 may partially overlap a first end portion of the gate electrode 314. The drain electrode 317 may be electrically connected to the active layer 312 through a second contact hole that is formed in the gate insulation layer 313 and the inorganic insulation layer 315. For example, the drain electrode 317 may contact a second end portion of the active layer 312. In addition, the drain electrode 317 may partially overlap a second end portion of the gate electrode 314.

The organic insulation layer 320 may be disposed on the inorganic insulation layer 315 on which the source electrode 316 and the drain electrode 317 are formed.

The organic light emitting diode 340 may include a pixel electrode 341, an intermediate layer 342, and a common electrode 343. The pixel electrode 341 may be disposed on the organic insulation layer 320. The pixel electrode 341 may be electrically connected to the drain electrode 317. In one example, the pixel electrode 341 may be used as an anode that provides positive holes. The intermediate layer 342 may be disposed on the pixel electrode 341. The intermediate layer 342 may sequentially include a hole injection layer (HIL), a hole transfer layer (HTL), an emission layer (EML), an electron transfer layer (ETL) and an electron injection layer (EIL). The pixel electrode 341 may provide positive holes to the HIL and the HTL. The common electrode 343 may provide electrons to the ETL and the EIL. The positive holes may be combined with the electrons in the EML to generate light having a desired wavelength. The common electrode 343 may be disposed on the intermediate layer 342. For example, the common electrode 343 may be used as a cathode that provides electrons.

The pixel defining layer 330 may be disposed on the organic insulation layer 320 on which the pixel electrode 341 is formed. The pixel defining pattern 330 may partially overlap two end portions of the pixel electrode 341. The pixel defining layer 330 may overlap the common electrode 343.

The display unit 300 may have a transmittance window in the transparent region TR. In one example embodiment, the transmittance window may be formed by removing or not forming the common electrode 343 and the pixel defining layer 330 in the transparent region TR.

Therefore, display unit 300 may display the image in the pixel region PR using the organic light emitting diode 340 and pass the external light through the transparent region TR.

The filling unit 500 may cover the display unit 300. The filling unit 500 may include a silicon filling material and a photochromic material.

The filling unit 500 may include the silicon filling material to increase the durability of the transparent organic light emitting display device without damage to the organic light emitting diode 340. When the transparent organic light emitting display device does not include the filling unit 500, and a space between the display unit 300 and the second substrate 900 is in a vacuum state, the sealing unit 700 may be damaged by external impact and moisture or gas may penetrate into the organic light emitting diode 340. Therefore, the filling unit 500 may include the silicon filling material to increase the durability of the transparent organic light emitting display device. In one example, the silicon filling material may include a polydimethysiloxane and a hydrosilane. In addition, the silicon filling material may further include at least one selected from a platinum catalyst and an inhibitor. The filling unit 500 including the silicon filling material may have characteristics such as low outgassing, high transparency, and high thermal resistance, thereby preventing damage to the organic light emitting diode 340.

Experiments were performed for measuring the durability of the transparent organic light emitting display device according to materials of the filling unit 500. In a comparative transparent organic light emitting display device in which the filling unit 500 included bisphenol A and bisphenol F that are epoxy materials, the out-gassing was relatively large, and the transparency was 95%. In addition, when the comparative transparent organic light emitting display device was tested at 95 degrees Celsius with a relative humidity of 85% for 300 hours, a color of the filling unit 500 was changed and the organic light emitting diode 340 was damaged. On the other hand, in an experimental transparent organic light emitting display device in which the filling unit 500 included the polydimethysiloxane and hydrosilane, the out-gassing was relatively small, and the transparency was 99%. In addition, when the experimental transparent organic light emitting display device was tested at 95 degrees Celsius with a relative humidity of 85% for 1000 hours, a color of the filling unit 500 was not changed and the organic light emitting diode 340 was not damaged. Therefore, the filling unit 500 may include the silicon filling material to increase the durability of the transparent organic light emitting display device without resulting in damage to the organic light emitting diode 340.

In addition, the filling unit 500 may include the photochromic material to increase the ability of information transfer of the transparent organic light emitting display device even under conditions of high ambient illumination. In one example, the photochromic material may include at least one selected from a silver chloride (AgCl), a silver bromide (AgBr), a silver iodide (AgI), a pyran, an oxazine, and a fulgide. The photochromic material (e.g., the silver chloride, silver bromide, silver iodide, pyran, oxazine, fulgide, etc) may be darkened by absorbing the light. Therefore, the filling unit 500 may include the photochromic material to prevent a visibility degradation of the transparent organic light emitting display device occurred by the external light. The photochromic material included in the filling unit 500 may be selected, and the mixing ratio of the photochromic material to silicon filling material may be determined, in consideration of light efficiency of the organic light emitting diode 340. The photochromic material may also absorb the light emitted by the organic light emitting diode 340, thereby decreasing the light efficiency of the organic light emitting diode 340. Also, the light efficiency and the visibility of the organic light emitting diode 340 can be affected by structure of the transparent organic light emitting display device such as a ratio of scale of the pixel region PR to scale of the transparent region TR. Therefore, the mixing ratio of the silicon filling material to the photochromic material may be experimentally determined according to characteristics of the transparent organic light emitting display device.

In one example, the organic light emitting diode 340 may be a top emission type organic light emitting diode. Thus, the transparent organic light emitting display device may emit light in a direction toward the second substrate 900, which opposes the first substrate 100 on which the thin film transistor 310 is disposed, thereby increasing the light efficiency of the organic light emitting diode 340. In addition, the filling unit 500 may absorb the external light incident from the direction at which the second substrate 900 is located, thereby preventing degraded visibility of the transparent organic light emitting display device, which may occur under high ambient illumination.

Although the examples of the exemplary embodiment of FIG. 3 describe that the transmittance window may be formed by removing the common electrode 343 and the pixel defining layer 330 in the transparent region TR, the transmittance window also can be formed by a variety of other methods. For example, the transmittance window may be formed by removing the common electrode 343, the pixel defining layer 330, the organic insulation layer 320, the inorganic insulation layer 315, the gate insulation layer 313, and the buffer layer 311 in the transparent region TR. When the transmittance window is relatively large, the transmittance of the transparent organic light emitting display device may be increased.

As shown in FIG. 4, the transparent organic light emitting display device may include a first substrate 100, a display unit 300, a photochromic layer 400A, a filling unit 500, and a second substrate 900. The transparent organic light emitting display device according to the present exemplary embodiment is substantially the same as the transparent organic light emitting display device of the exemplary embodiment described in FIG. 3, except that the photochromic layer 400A is added. Therefore, the same reference numerals will be used to refer to the same or like parts as those described in the previous exemplary embodiment of FIG. 3, and any repetitive explanation concerning the above elements will be omitted.

The photochromic layer 400A may be disposed on at least one selected from the first substrate 100 and the second substrate 900. A color of the photochromic layer 400A may be changed by external light. For example, the photochromic layer 400A may be disposed on the second substrate 900. When the external light is incident on the transparent organic light emitting display device under high ambient illumination, the visibility of the transparent organic light emitting display device may be decreased. The photochromic layer 400A may absorb the external light incident from the direction at which the second substrate 900 is located and may be darkened, thereby increasing the visibility of the transparent organic light emitting display device. The photochromic layer 400A may include a variety of materials of which color is changed by absorbing the light. In one example, the photochromic layer 400A may include at least one selected from a silver chloride (AgCl), a silver bromide (AgBr), a silver iodide (AgI), a pyran, an oxazine, and a fulgide.

As shown in FIG. 5, the transparent organic light emitting display device may include a first substrate 100, a display unit 300, a photochromic layer 400B, a filling unit 500, and a second substrate 900. The transparent organic light emitting display device according to the present exemplary embodiment is substantially the same as the transparent organic light emitting display device of the exemplary embodiment described in FIG. 3, except that the photochromic layer 400B is added. Therefore, the same reference numerals will be used to refer to the same or like parts as those described in the previous exemplary embodiment of FIG. 3, and any repetitive explanation concerning the above elements will be omitted.

The photochromic layer 400B may be disposed on at least one selected from the first substrate 100 and the second substrate 900. A color of the photochromic layer 400B may be changed by the external light. The photochromic layer 400B may be disposed at least in part on the transparent region TR. For example, the photochromic layer 400B may be disposed at least in part on the second substrate 900 corresponding to the transparent region TR. When the external light is incident on the transparent organic light emitting display device under high ambient illumination, a visibility of the transparent organic light emitting display device may be decreased. The photochromic layer 400B may absorb the external light incident from the direction at which the second substrate 900 is located and may be darkened, thereby increasing the visibility of the transparent organic light emitting display device. However, the photochromic layer 400B may also absorb the light emitted by the organic light emitting diode 340, thereby decreasing the light efficiency of the organic light emitting diode 340. Therefore, the photochromic layer 400B may be disposed at least in part on the transparent region TR to increase a visibility of the transparent organic light emitting display device without degradation of the light efficiency of the organic light emitting diode 340

Figure 6:
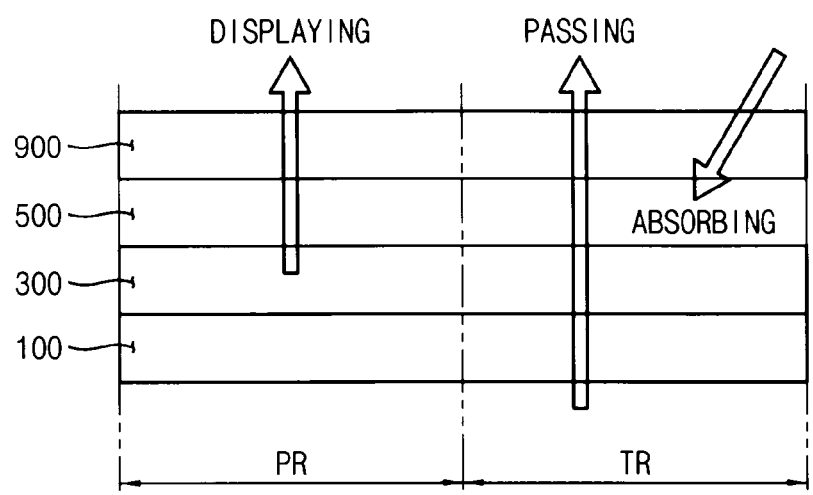
FIG. 6 is a diagram illustrating an example of absorbing external light by a transparent organic light emitting display device of FIG. 1.

FIG. 6 is a diagram illustrating an example of absorbing external light by the transparent organic light emitting display device of FIG. 1.

Referring to FIG. 6, the transparent organic light emitting display device may display an image using the organic light emitting diode in the pixel region PR to provide the display information to user. In addition, the transparent organic light emitting display device may pass external light through the transparent region TR to provide the opposite situation to the user. The filling unit 500 of the transparent organic light emitting display device may include a silicon filling material and a photochromic material to increase the durability of the transparent organic light emitting display device and to increase the ability of information transfer under high ambient illumination.

The filling unit 500 including the photochromic material may absorb the external light incident from a direction at which the second substrate 900 is located, and the photochromic material may be darkened. Therefore, the image displayed on the pixel region PR may be clearly visible. Further, the filling unit 500 may absorb the external light incident from a direction at which the first substrate 100 is located. Therefore, although luminance of the external light is relatively large, the filling unit 500 may increase the visibility and the ability of information transfer.

Figure 7:
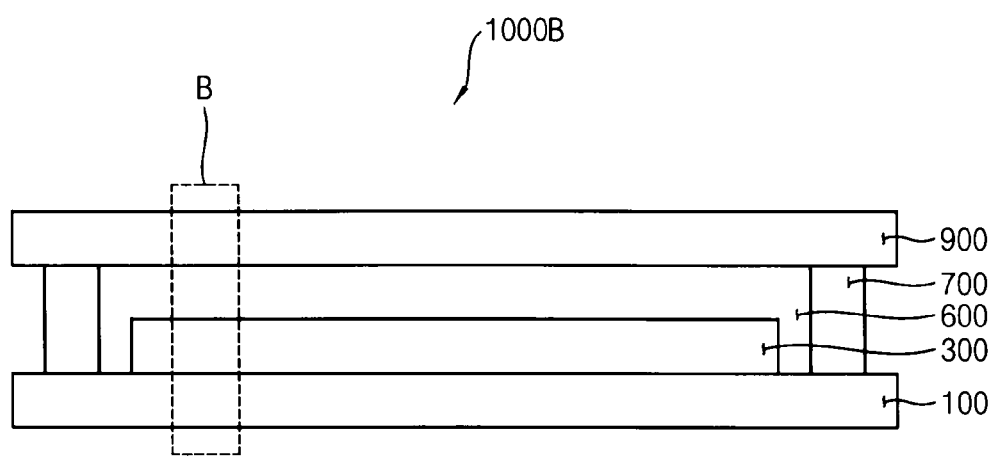
FIG. 7 is a cross-sectional view illustrating a transparent organic light emitting display device according to another exemplary embodiment.

FIG. 7 is a cross-sectional view illustrating a transparent organic light emitting display device according to another exemplary embodiment.

Referring to FIG. 7, the transparent organic light emitting display device 1000B may include a first substrate 100, a display unit 300, a sealing unit 700, and a second substrate 900. The transparent organic light emitting display device 1000B according to the present exemplary embodiment is substantially the same as the transparent organic light emitting display device of the exemplary embodiment described in FIG. 1, except that a filling space 600 is added instead of the filling unit 500. Therefore, the same reference numerals will be used to refer to the same or like parts as those described in the previous exemplary embodiment of FIG. 1, and any repetitive explanation concerning the above elements will be omitted.

The sealing unit 700 may be disposed between the first substrate 100 and the second substrate 900 to surround the display unit 300. The sealing unit 700 may bond the first substrate 100 to the second substrate 900. The filling space 600 disposed between the first substrate 100 and the second substrate 900 may be sealed by the sealing unit 700. The filling space 600 may be in a vacuum state, or may include silicon filling material. The silicon filling material may have characteristics, such as low out-gassing, high transparency, and high thermal resistance. Therefore, when the filling space 600 includes the silicon filling material, the filling space 600 may increase a durability of the transparent organic light emitting display device 1000B without damage to the organic light emitting diode The transparent organic light emitting display device 1000B may include a photochromic layer. The photochromic layer may be disposed on at least one selected from the first substrate 100 and the second substrate 900 or inside of the display unit 300. The photochromic layer may absorb the external light and may be darkened. The photochromic layer may be disposed at least in part on the transparent region TR to increase the ability of information transfer under high ambient illumination without a degradation of the light efficiency of the organic light emitting diode.

Figure 8:
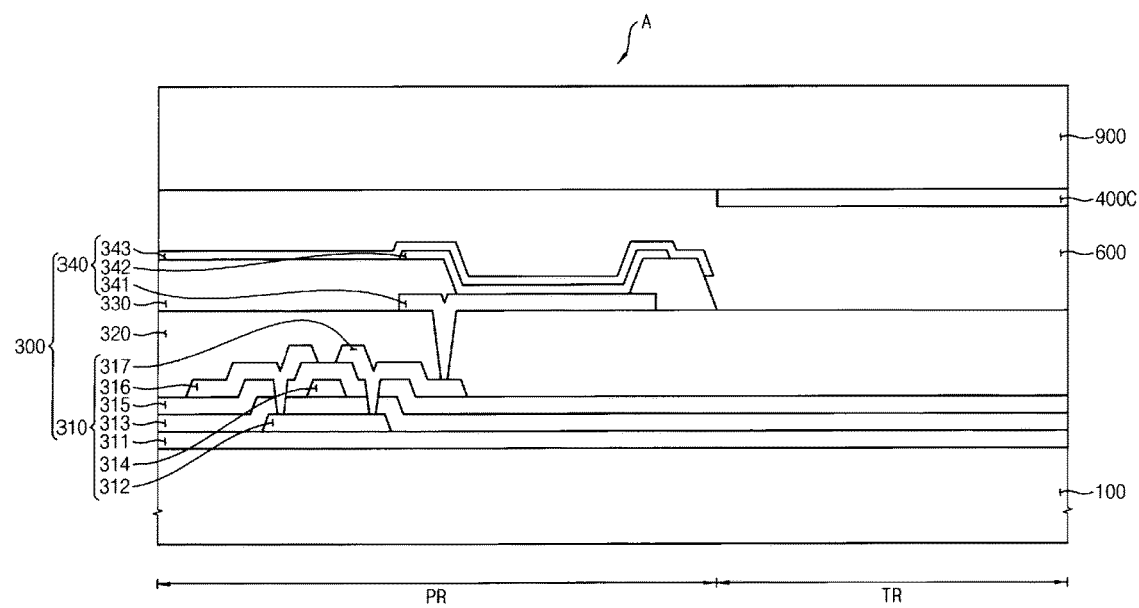
FIGS. 8 through 10 are cross-sectional views illustrating examples of a portion 'B' of FIG. 7.
Figure 9:
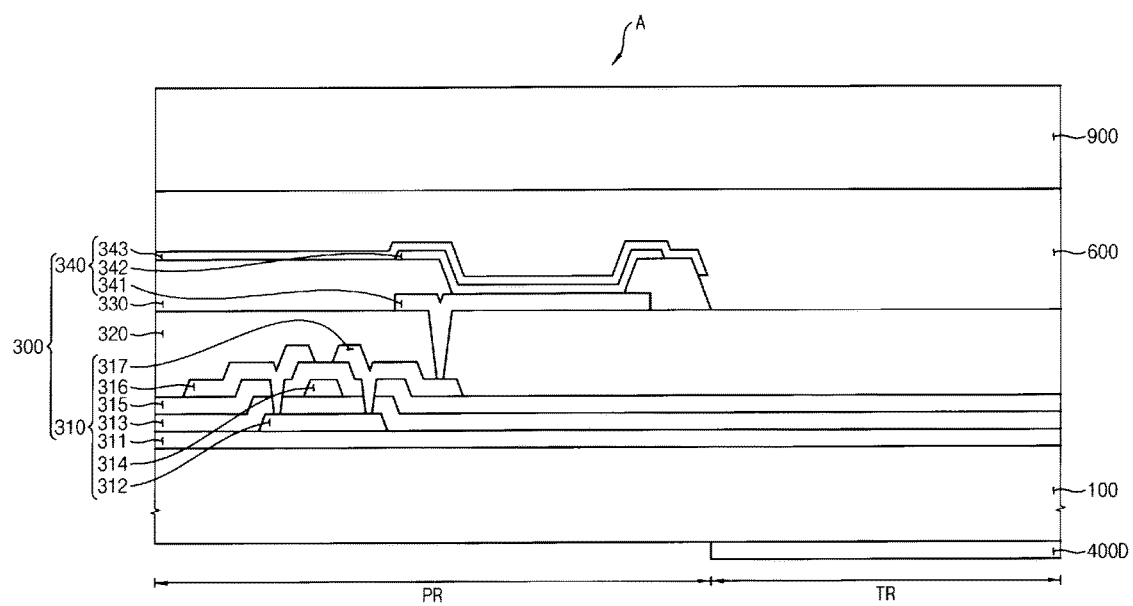
Figure 10:
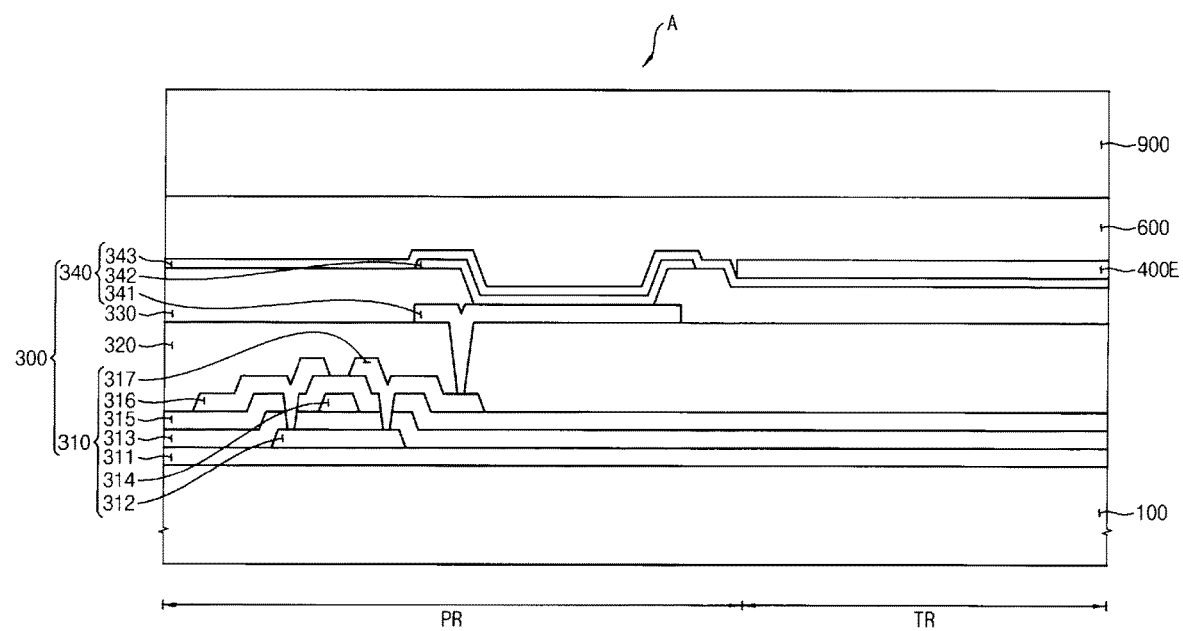

FIGS. 8 through 10 are cross-sectional views illustrating examples of a portion 'B' of FIG. 7.

Referring to FIGS. 8 through 10, the transparent organic light emitting display device may include a photochromic layer for absorbing external light, thereby increasing the ability of information transfer under high ambient illumination.

As shown in FIGS. 8 and 9, the transparent organic light emitting display device may include a first substrate 100, a display unit 300, a photochromic layer 400C/400D, a filling space 600, and a second substrate 900. The transparent organic light emitting display device according to the present exemplary embodiment is substantially the same as the transparent organic light emitting display device of the exemplary embodiment described in FIG. 3, except that the photochromic layer 400C 400D and the filling space 600 are added instead of the filling unit 500. Therefore, the same reference numerals will be used to refer to the same or like parts as those described in the previous exemplary embodiment of FIG. 3, and any repetitive explanation concerning the above elements will be omitted.

The filling space 600 may be in a vacuum state or may include silicon filling material. The filling space 600 is described above, duplicated descriptions will be omitted.

The photochromic layer 400C/400D may absorb the external light and may be darkened. Therefore, the photochromic layer 400C/400D may increase a visibility of the transparent organic light emitting display device. The photochromic layer 400C/400D may include a variety of materials of which color is changed by absorbing the light. In one example, the photochromic layer 400C 400D may include at least one selected from a silver chloride (AgCl), a silver bromide (AgBr), a silver iodide (AgI), a pyran, an oxazine, and a fulgide.

In one example, as shown in FIG. 8, the photochromic layer 400C may be disposed at least in part on the second substrate 900 corresponding to the transparent region TR, and the organic light emitting diode 340 may be a top emission type organic light emitting diode. In another example, as shown in FIG. 9, the photochromic layer 400D may be disposed at least in part on the first substrate 100 corresponding to the transparent region TR, and the organic light emitting diode 340 may be a bottom emission type organic light emitting diode. Thus, the photochromic layer 400C/400D of the transparent organic light emitting display device may be disposed on a substrate which opposes the user. Therefore, the photochromic layer 400C/400D may prevent the visibility degradation of the transparent organic light emitting display device that may be produced by the external light incident from a direction at which the user is located.

The photochromic layer 400C/400D may also absorb the light emitted by the organic light emitting diode 340, thereby decreasing the light efficiency of the organic light emitting diode 340. Therefore, the photochromic layer 400C/400D may be disposed at least in part on the transparent region TR to increase the visibility of the transparent organic light emitting display device without degrading the light efficiency of the organic light emitting diode 340.

As shown in FIG. 10, the transparent organic light emitting display device may include a first substrate 100, a display unit 300, a photochromic layer 400E, a filling space 600, and a second substrate 900. The transparent organic light emitting display device according to the present exemplary embodiment is substantially the same as the transparent organic light emitting display device of the exemplary embodiment described in FIG. 8, except that the photochromic layer 400E is formed inside of the display unit 300. Therefore, the same reference numerals will be used to refer to the same or like parts as those described in the previous exemplary embodiment of FIG. 8, and any repetitive explanation concerning the above elements will be omitted.

The photochromic layer 400E may absorb the external light and may be darkened. The photochromic layer 400E may be formed inside of the display unit 300. In one example, the photochromic layer 400E may be disposed on the common electrode 343. For example, the photochromic layer 400E may be disposed on the common electrode 343 corresponding to the transparent region TR. Therefore, the photochromic layer 400E may increase a visibility of the transparent organic light emitting display device without degrading the light efficiency of the organic light emitting diode 340.

Although it is described that the photochromic layer 400E is disposed on the common electrode 343 in FIG. 10, the photochromic layer 400E can be formed inside of the display unit 300. For example, the photochromic layer 400E is disposed on the buffer layer 311 to absorb the external light and to increase the visibility of transparent organic light emitting display device.

Although the exemplary embodiments above disclose that the thin-film transistor has a top gate structure in which a gate insulation layer, a gate electrode, an inorganic insulation layer, and source/drain electrodes are arranged above an active layer, the thin-film transistor can alternatively have a bottom gate structure in which a gate electrode is arranged under an active layer.

The present inventive concept may be applied to an electronic device having the transparent organic light emitting display device. For example, the present inventive concept may be applied to an outdoor billboard, a personal computer (PC), a cellular phone, a smart phone, a smart pad, a personal digital assistant (PDA), etc.

The durability of a transparent organic light emitting display device according to the present invention is improved because a filling unit includes a silicon filling material. Further, the ability of information transfer of the transparent organic light emitting display device is increased regardless of ambient illumination, because the filling unit includes a photochromic material.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A transparent organic light emitting display device comprising a pixel region on which an image is displayed and a transparent region through which external light passes, the device comprising:
    a first substrate;
    a second substrate opposing the first substrate;
    a display unit disposed between the first substrate and the second substrate, the display unit comprising an organic light emitting diode in the pixel region;
    a sealing unit disposed between the first substrate and the second substrate to surround the display unit and configured to bond the first substrate to the second substrate;
    a first photochromic layer disposed on at least one selected from the first substrate and the second substrate, a color of the first photochromic layer being changeable by exposure to the external light; and
    a filling unit disposed in an inner side of the sealing unit to cover the display unit, the filling unit comprising a silicon filling material and a photochromic material, a space between the first substrate and the second substrate being filled with the filling unit,
    wherein:
    the silicon filling material comprises a mixed material of a polydimethysiloxane and a hydrosilane;

the photochromic material comprises at least one selected from a silver chloride (AgCl), a silver bromide (AgBr), a silver iodide (AgI), and an oxazine;

the organic light emitting diode comprises a pixel electrode, an emitting layer, and a common electrode; and the first photochromic layer at least partially overlaps the transparent region and does not overlap the emitting layer.

2. The device of claim 1, wherein the silicon filling material further comprises at least one selected from a platinum catalyst and an inhibitor.

3. The device of claim 1, wherein the first photochromic layer comprises at least one selected from a silver chloride (AgCl), a silver bromide (AgBr), a silver iodide (AgI), a pyran, an oxazine, and a fulgide.

4. The device of claim 1, wherein the organic light emitting diode is a top emission type organic light emitting diode.

5. The device of claim 1, wherein:
the display unit further comprises a transmittance window in the transparent region;
the external light passes through the first substrate, the transmittance window, and the second substrate in the transparent region; and
the first photochromic layer at least partially overlaps the transmittance window.

6. The device of claim 1, wherein:
the display unit further comprises a second photochromic layer, a color of which is changeable by exposure to the external light; and
the second photochronic layer at least partially overlaps the transparent region and does not overlap the emitting layer.

7. The device of claim 6, wherein the second photochromic layer comprises at least one selected from a silver chloride (AgCl), a silver bromide (AgBr), a silver iodide (AgI), a pyran, an oxazine, and a fulgide.

8. The device of claim 6, wherein
the second photochromic layer is disposed on at least one side of the common electrode.

9. A transparent organic light emitting display device comprising a pixel region on which an image is displayed and a transparent region through which external light passes, the device comprising:
a first substrate;
a second substrate opposing the first substrate;
a display unit disposed between the first substrate and the second substrate, the display unit comprising an organic light emitting diode in the pixel region; and
a photochromic layer disposed on at least one selected from the first substrate and the second substrate, a color of the photochromic layer being changeable by exposure to the external light,
wherein:
the organic light emitting diode comprises a pixel electrode, an emitting layer, and a common electrode; and
the photochromic layer at least partially overlaps the transparent region and does not overlap the emitting layer.

10. The device of claim 9, wherein the photochromic layer comprises at least one selected from a silver chloride (AgCl), a silver bromide (AgBr), a silver iodide (AgI), a pyran, an oxazine, and a fulgide.

11. The device of claim 9, wherein:
the photochromic layer is disposed on the first substrate; and
the organic light emitting diode is a bottom emission type organic light emitting diode.

12. The device of claim 9, wherein:
the photochromic layer is disposed on the second substrate; and
the organic light emitting diode is a top emission type organic light emitting diode.

13. The device of claim 9, wherein:
the display unit further comprises a transmittance window in the transparent region;
the external light passes through the first substrate, the transmittance window, and the second substrate in the transparent region; and
the photochromic layer at least partially overlaps the transmittance window.

14. A transparent organic light emitting display device comprising a pixel region on which an image is displayed and a transparent region through which external light passes, the device comprising:
a first substrate;
a second substrate opposing the first substrate;
a display unit disposed on the first substrate, the display unit comprising an organic light emitting diode in the pixel region;
a photochromic layer disposed on the display unit, a color of the photochromic layer being changeable by exposure to the external light; and
a filling unit disposed between the display unit and the photochromic layer, the filling unit comprising a silicon filling material and a photochromic material
wherein:
the organic light emitting diode comprises a pixel electrode, an emitting layer, and a common electrode; and
the first photochromic layer at least partially overlaps the transparent region and does not overlap the emitting layer.

15. The device of claim 14, wherein:
the display unit further comprises a transmittance window in the transparent region;
the external light passes through the first substrate, the transmittance window, and the second substrate in the transparent region; and
at least a portion of the photochromic layer is disposed on the transmittance window.

16. The device of claim 14, wherein the photochromic layer is disposed on the common electrode.

* * * * *